(12) United States Patent
Redaelli et al.

(10) Patent No.: US 8,847,186 B2
(45) Date of Patent: Sep. 30, 2014

(54) SELF-SELECTING PCM DEVICE NOT REQUIRING A DEDICATED SELECTOR TRANSISTOR

(75) Inventors: Andrea Redaelli, Calolziocorte (IT); Agostino Pirovano, Milan (IT)

(73) Assignee: Micron Technology, Inc., Boise, ID (US)

( * ) Notice: Subject to any disclaimer, the term of this patent is extended or adjusted under 35 U.S.C. 154(b) by 608 days.

(21) Appl. No.: 12/651,097

(22) Filed: Dec. 31, 2009

(65) Prior Publication Data

US 2011/0155984 A1    Jun. 30, 2011

(51) Int. Cl.
*H01L 45/00* (2006.01)
*H01L 27/24* (2006.01)
*H01L 29/861* (2006.01)

(52) U.S. Cl.
CPC ............ *H01L 27/2409* (2013.01); *H01L 45/06* (2013.01); *H01L 29/8615* (2013.01); *G11C 2213/73* (2013.01); *H01L 45/126* (2013.01); *G11C 2213/72* (2013.01); *H01L 45/144* (2013.01)
USPC .......................... 257/2; 257/43; 257/E47.001

(58) Field of Classification Search
CPC ........ H01L 45/04; H01L 45/06; H01L 45/065
USPC .................................................... 257/2, 42, 43
See application file for complete search history.

(56) References Cited

U.S. PATENT DOCUMENTS

| | | | |
|---|---|---|---|
| 2006/0158928 A1* | 7/2006 | Pellizzer et al. | 365/163 |
| 2007/0116986 A1* | 5/2007 | Garg et al. | 428/701 |
| 2007/0184613 A1* | 8/2007 | Kim et al. | 438/257 |
| 2008/0121865 A1* | 5/2008 | Ahn et al. | 257/5 |

* cited by examiner

*Primary Examiner* — Minchul Yang
(74) *Attorney, Agent, or Firm* — Schwegman Lundberg & Woessner, P.A.

(57) ABSTRACT

A Zinc Oxide (ZnO) layer deposited using Atomic Layer Deposition (ALD) over a phase-change material forms a self-selected storage device. The diode formed at the ZnO/GST interface shows both rectification and storage capabilities within the PCM architecture.

6 Claims, 9 Drawing Sheets

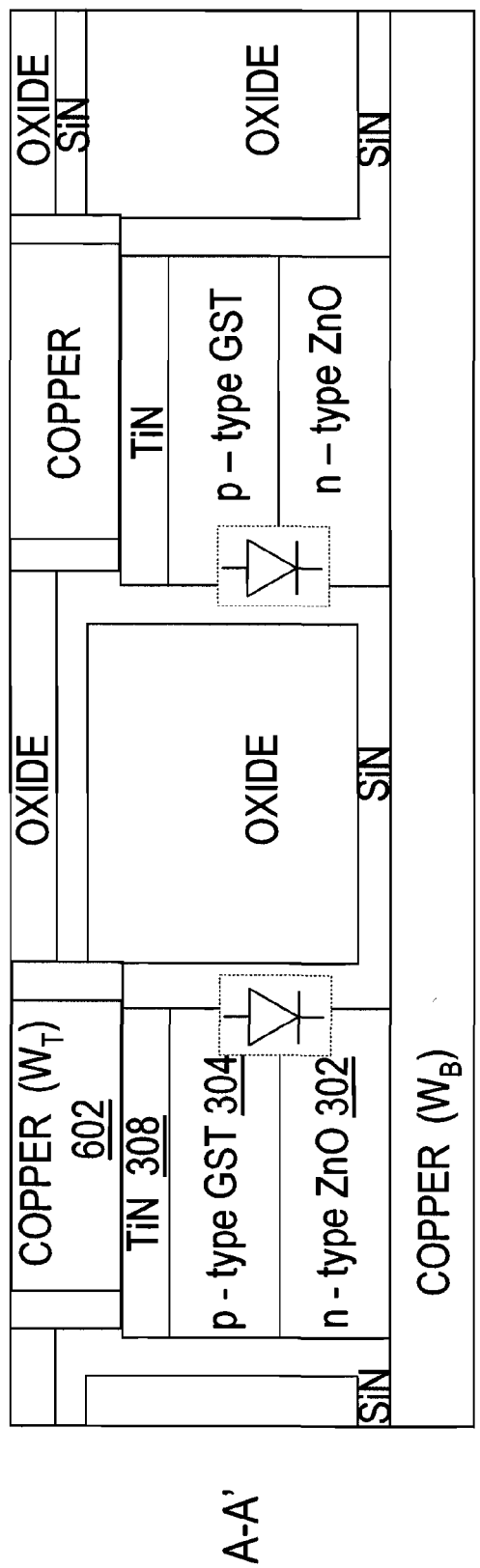
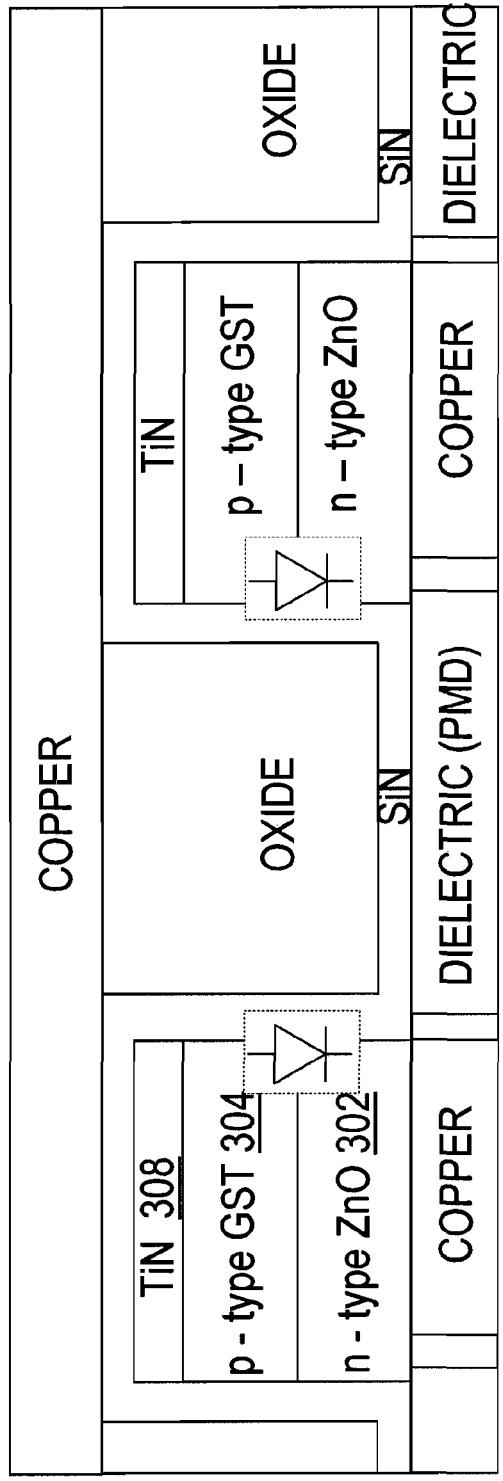
FIG. 6

SELF-SELECTING PCM DEVICE NOT REQUIRING A DEDICATED SELECTOR TRANSISTOR

BACKGROUND OF THE INVENTION

Floating gate memories are self selected devices where the selecting functions and the storage functions are realized in a unique device. However, this type of nonvolatile memory is being replaced by Phase Change Memory (PCM) for the next generation due to favorable write speeds, smaller cell sizes, simpler circuitries and a fabrication compatibility with the Complementary Metal-Oxide-Semiconductor (CMOS) process. Current PCM uses a dedicated selection device, usually a MOS or a BJT transistor, to select the memory cell for reading and writing. The selection device requires additional masks and process complexity, and therefore, improvements are needed in the selection device for selecting the memory cell.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 6 illustrates bitline formation and definition in accordance with the present invention;

Figure 1:
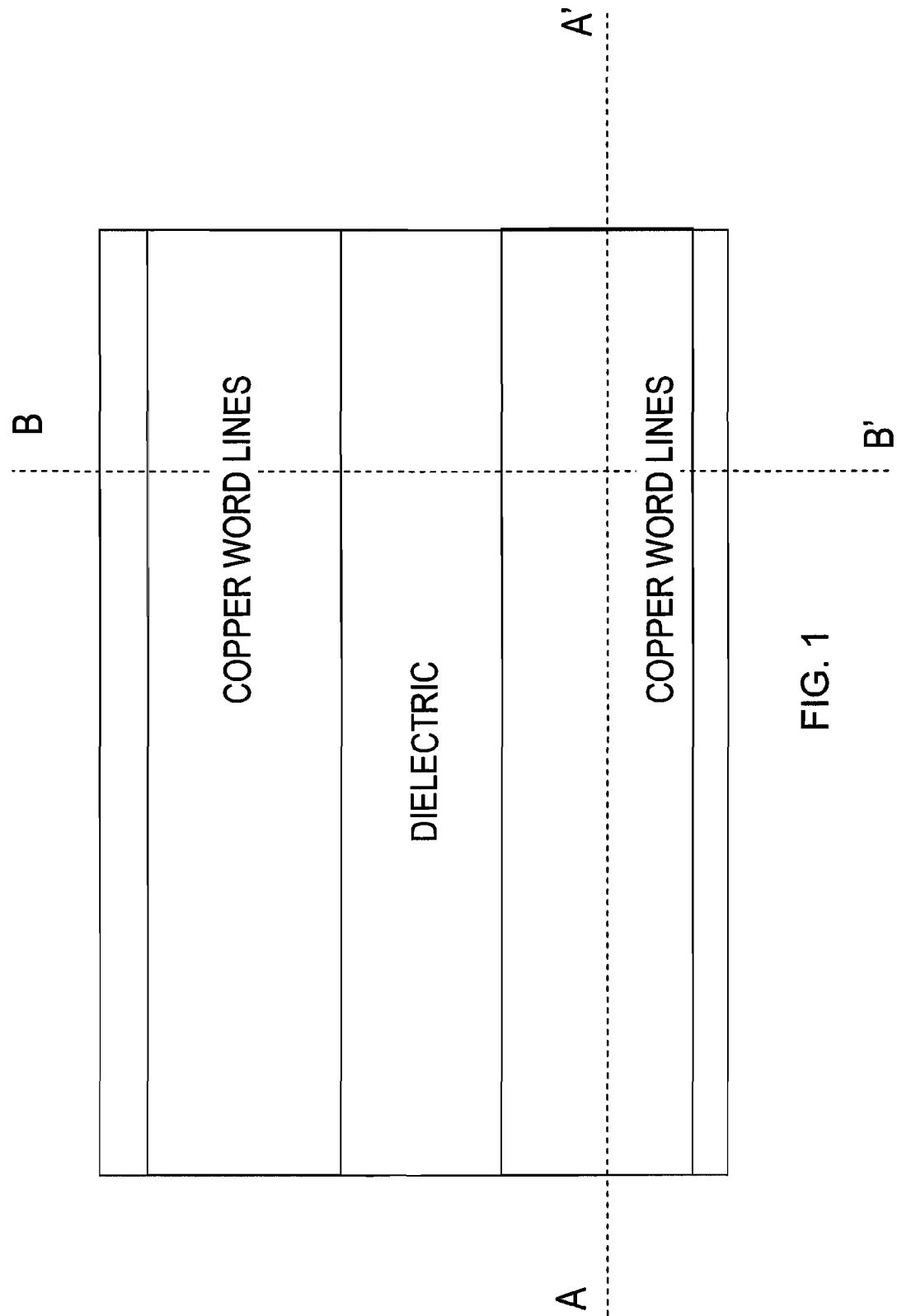
FIG. 1 shows a storage device that illustrates a first view A-A' and a second view B-B'.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

It should be understood that the terms "coupled" and "connected", along with their derivatives, are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

Figure 2:
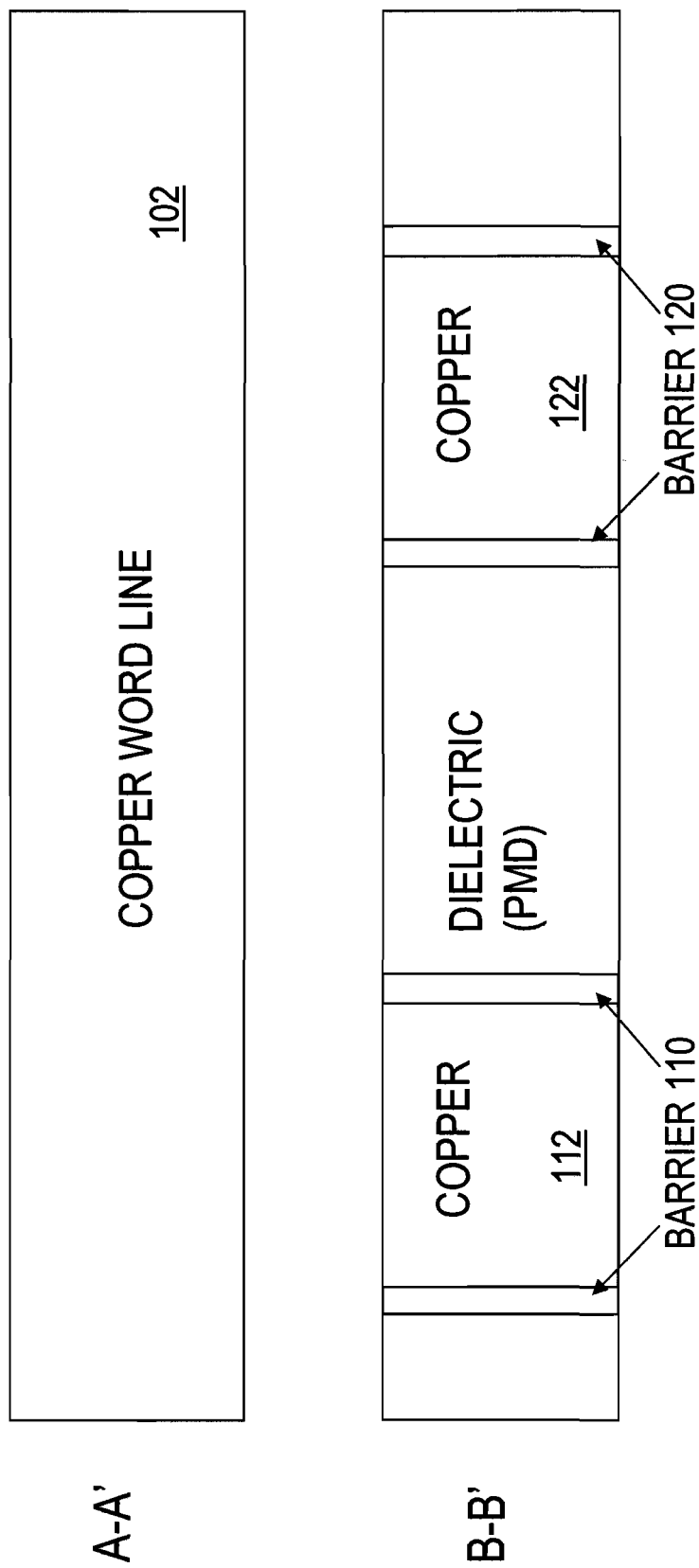
FIG. 2 is a view along a A-A' axis of a deposited copper word line and other word lines as viewed along the B-B' axis.

FIG. 1 shows a top view of a storage device that illustrates a first view along the A-A' axis and a second orthogonal view along the B-B' axis. These two views are used in FIGS. 2-6 to show the fabrication compatibility that places PCM devices into the Complementary Metal-Oxide-Semiconductor (CMOS) process. Specifically, FIG. 2 is a side view along the A-A' axis and the B-B' axis that shows a deposited copper word line. Note that these views illustrate an initial process step in the fabrication of the PCM storage elements that follow the CMOS process that fabricates CMOS logic gates.

Figure 3:
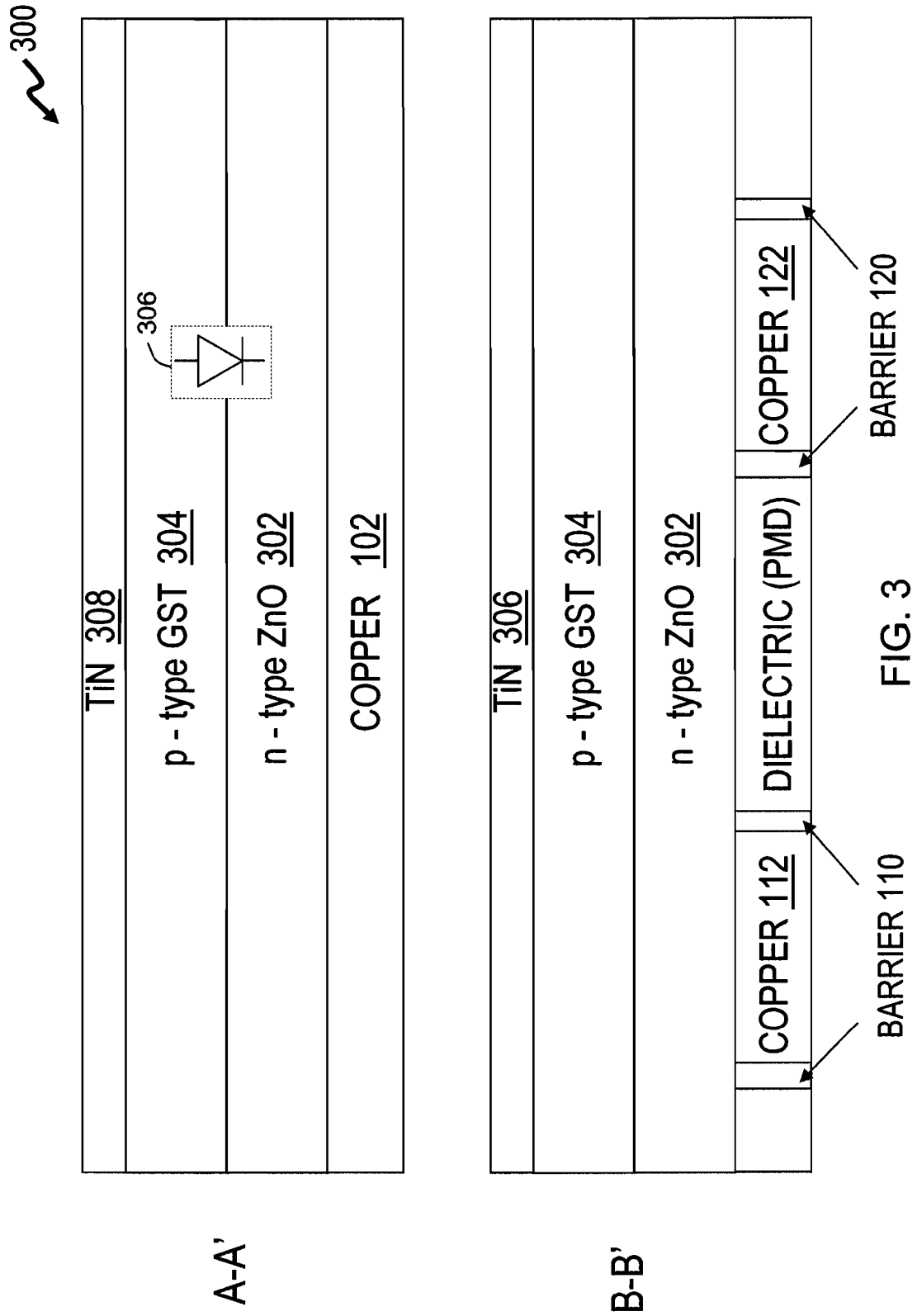
FIG. 3 illustrates a cross-sectional view of a stack of deposited materials that include n-type ZnO, p-type GST, and TiN in accordance with the present invention as viewed along the A-A' axis and the B-B' axis.

FIG. 3 illustrates a cross-sectional view along the A-A' axis and the B-B' axis of deposited materials stacked with n-type ZnO 302, p-type GST 304, and TiN 308 in accordance with the present invention. The figure shows a self-heated PCM storage device 300 fabricated having a Ge—Sb—Te (GST) material 304 deposited directly on top of a Zinc Oxide (ZnO) layer 302 without losing the storage capability of the GST material. The stack forms a heterojunction diode 306 at the junction of the p-type GST material 304 with the n-type ZnO layer.

Using a manufacturing process as shown in FIG. 3, a system memory with phase change materials may be fabricated that exhibits phase transitions due to changes in temperature. By including the alloys of elements of group VI of the periodic table, referred to as chalcogenides or chalcogenic materials, the memory cells may be programmed by resistive heating with current pulses that transition the memory cell between a high resistance state (an amorphous phase, reset state) and a low resistance state (a crystalline phase, set state). Thus, chalcogenides may be used advantageously in the illustrated process to provide data retention in phase change memory cells that remain stable even after the power is removed from the nonvolatile memory.

In the CMOS/PCM manufacturing process the ZnO coating may be deposited using Atomic Layer Deposition (ALD) which provides a film growth that is self-limiting based on surface reactions that make atomic scale deposition control possible. During fabrication this coating process introduces into a process chamber a gas that deposits a monolayer on the wafer surface. A second gas introduced into the chamber reacts with the first precursor to produce a monolayer of film on the substrate whose layer thickness is precisely controlled by the number of deposition cycles. Thus, the ALD process may be carried out at relatively low temperatures and provide Angstrom-level thickness control with super-conformal films that are pinhole-free.

As previously mentioned, by processing the GST layer 304 to be in contact with the ZnO layer 302, the interface forms a GST/ZnO heterojunction. The crystalline GST material 304 is naturally p-type and the ZnO material 302 is n-type, with the resulting diode 306 having good rectifying properties.

Diode 306 may be employed for selecting the GST memory cell storage element which eliminates the use of a dedicated selection transistor for each memory cell in the PCM array. Thus, depositing p-type crystalline GST layer 304 directly above the n-type Zinc Oxide (ZnO) layer 302 forms a GST/ZnO junction embedded in the PCM storage element, and the formed diode reduces the stack and the subsequent process complexity, also saving a number of masks related to the selection device fabrication.

Figure 4:
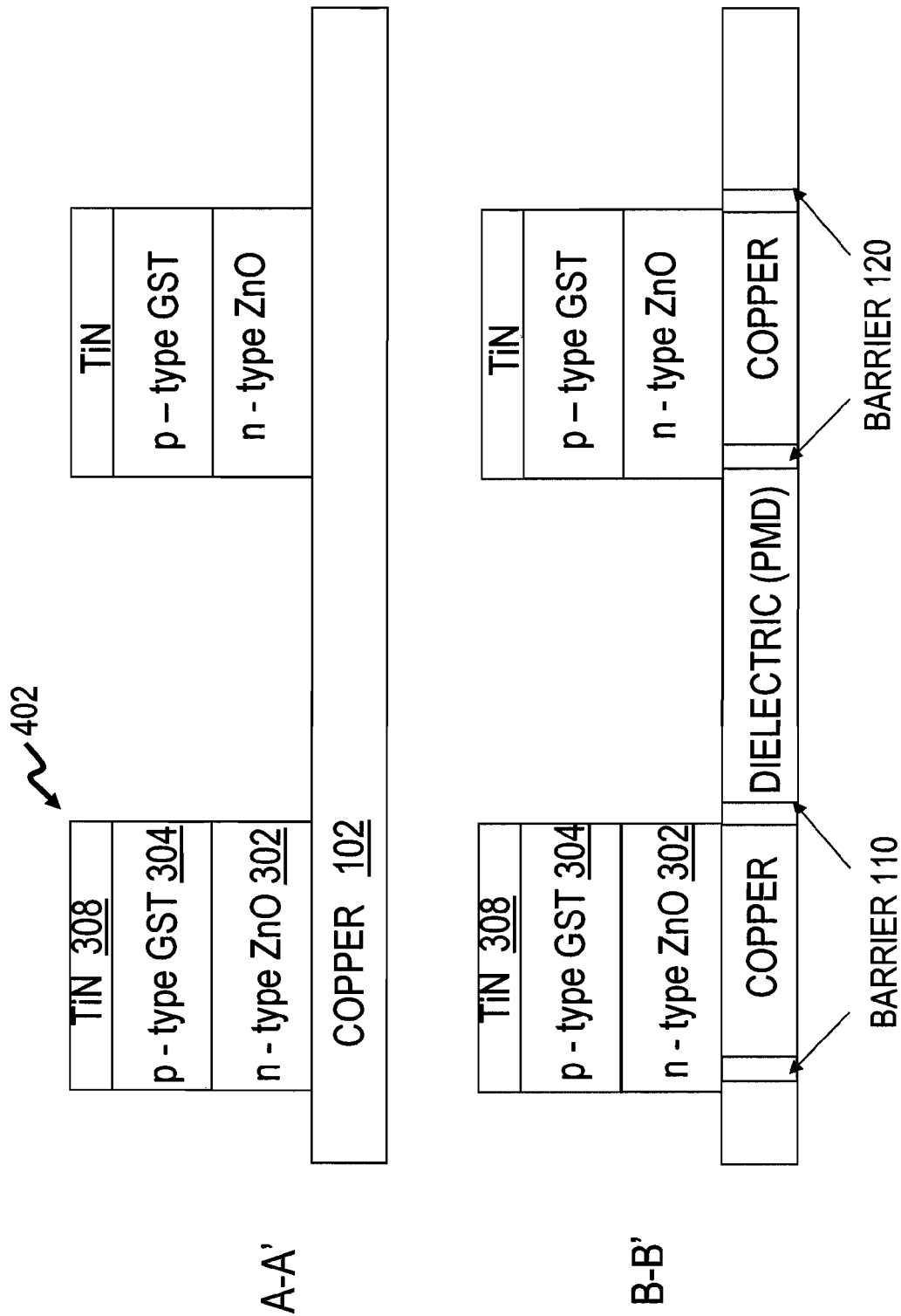
FIG. 4 illustrates a cross-section of a dot defined for a PCM memory storage device fabricated with Zinc Oxide (ZnO) that is deposited with an Atomic Layer Deposition (ALD) process adjacent to GST material in accordance with the present invention.
Figure 5:
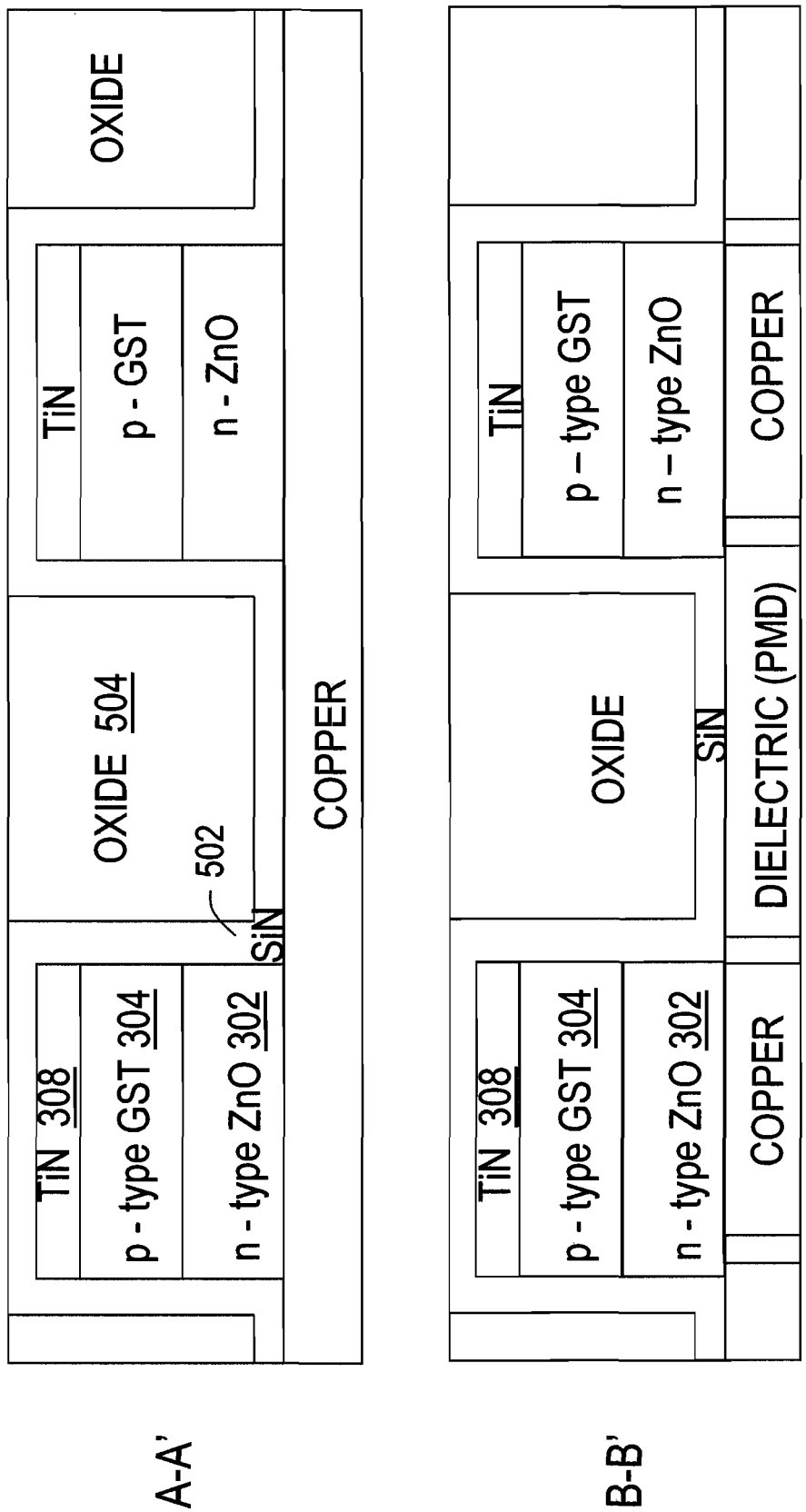
FIG. 5 illustrates cell sealing and dielectrics filling following deposition of the stack in accordance with the present invention.

FIG. 4 illustrates a cross-section of a dot 402 defined for the self-heated PCM storage device 300 fabricated with a p-type GST material 304 adjacent to the n-type ZnO material 302. FIG. 5 illustrates cell sealing SiN 502 and dielectrics filling 504 following deposition of the stack in accordance with the present invention. FIG. 6 illustrates the bitline 602 formation and definition. A positive bias applied to a top contact ($W_T$) with respect to the bottom contact ($W_B$) turns on the selector device.

Figure 7:
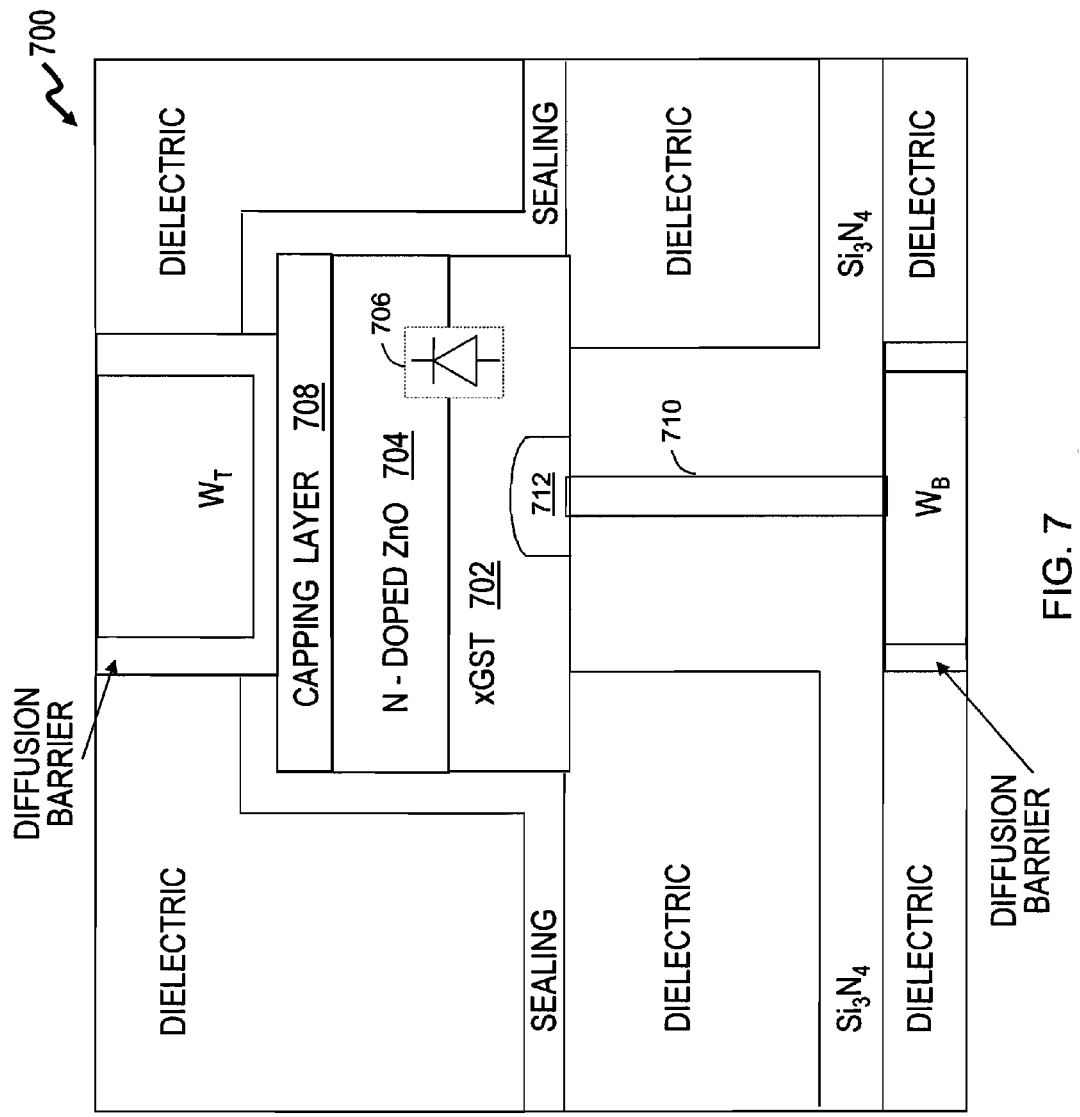
FIG. 7 illustrates lance heater definition in a PCM architecture in accordance with the present invention.
Figure 8:
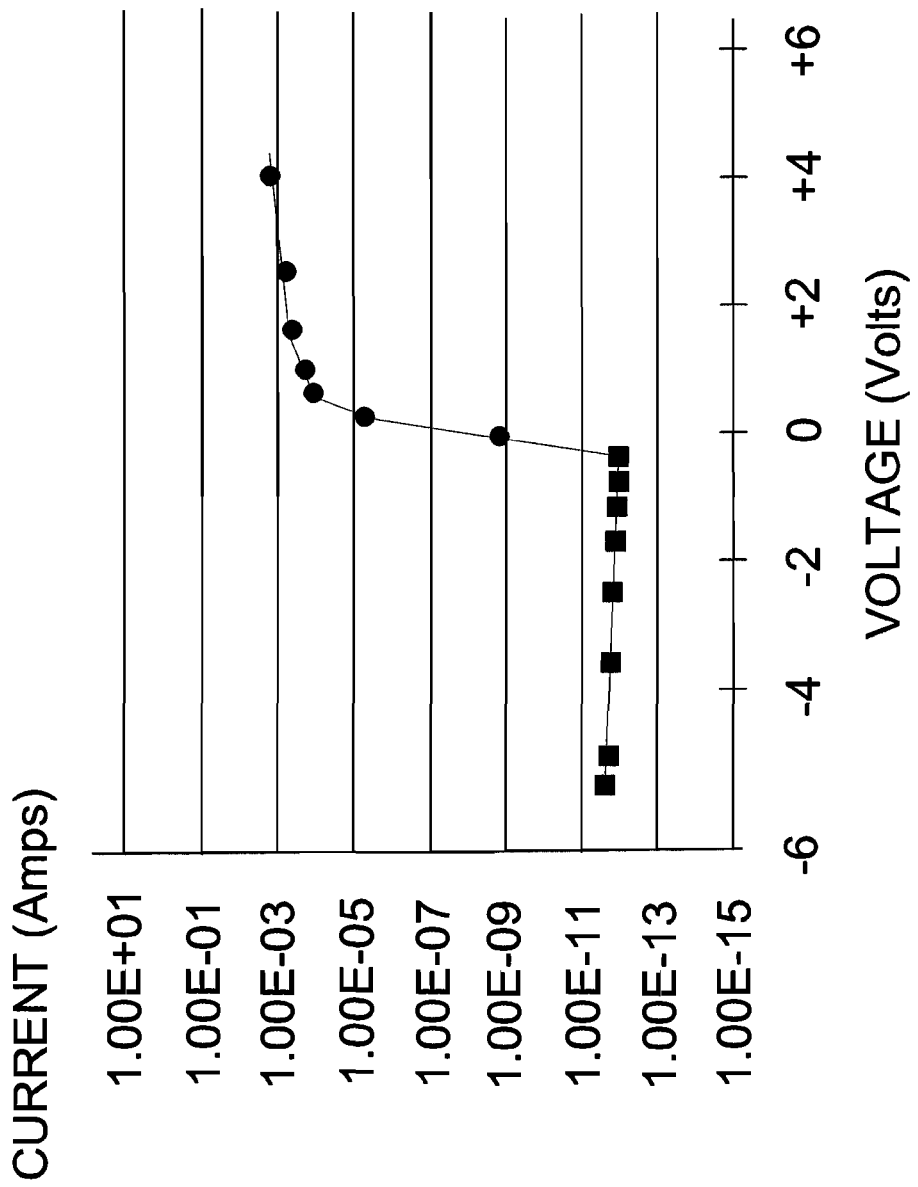
FIG. 8 shows the I-V electrical characteristics of the GST/ZnO heterojunction for the embodiment of a memory device that utilizes the heater element illustrated in FIG. 7.

FIG. 7 illustrates an embodiment of a PCM storage device 700 having a heater 710 and a GST dot region 712 that is involved in the phase change. An n-type ZnO layer 704 covers the GST layer 702 to form a PN junction. It should be noted that a lance-based cell is described, but other PCM cell architectures such as for example, a wall device, a pore device, or a Trench device may incorporate features of the present invention. Thus, other PCM cell architectures may deposit a ZnO layer 704 and a capping layer 708 after the deposition of GST layer 702, where the whole stack is subsequently etched. The GST dot region 712 is formed close to the heater element and is involved in the phase change and is also part of the rectifying junction constituted by GST layer 702 and ZnO layer 704. It should be clear that GST layer 702 is simultaneously part of both the selection and the storage element, thus realizing a self-selected device:

FIG. 8 provides the I-V electrical characteristics of the p-type GST layer and the n-type ZnO heterojunction. The electrical properties of the junction are illustrated for a ground potential applied to the ZnO layer 704 and a positive voltage applied to GST layer 702, and also for a negative voltage applied to the GST layer to reverse bias the junction. The voltage on the X-axis is the difference between the bottom contact voltage and the top contact voltage. A ratio of an "on" current to an "off" current as designated by Ion/Ioff has a value of approximately 109 for a diode with an area of 100 nm×100 nm and an "Ion" current of 1 mA biased at 3 volts. The data for the current Ion/Ioff is provided as one example and other ratios may be used without limiting the claimed subject matter.

Figure 9:
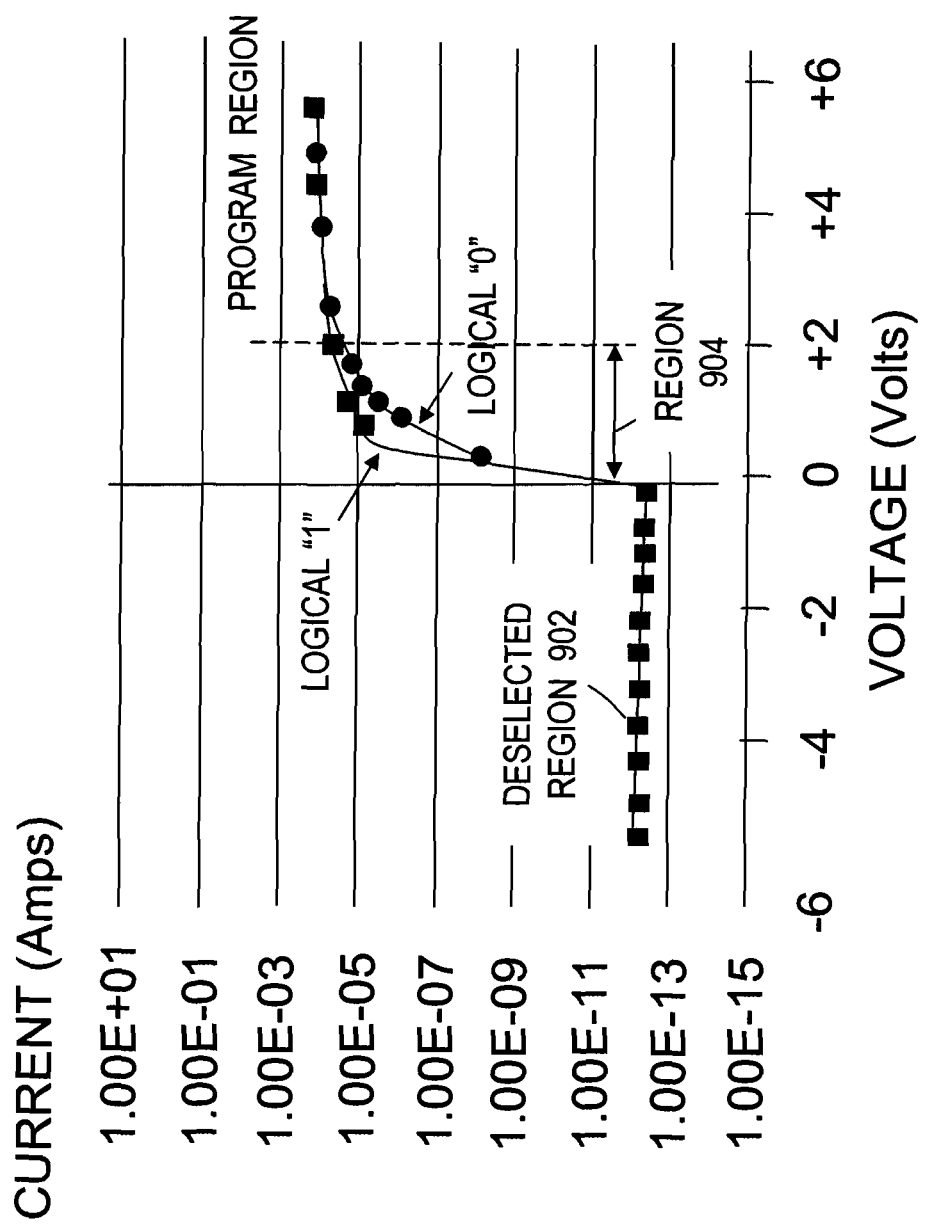
FIG. 9 shows the I-V electrical characteristics for the self selected device, showing a deselected region and a selection region for detecting a resistance of the memory device.

FIG. 9 describes the I-V electrical characteristics for the self selected device. With the diode that is formed at the GST/ZnO junction reversed biased, both of the states of PCM storage device 700 are deselected as described by deselected region 902. With a positive voltage supplied to forward bias the diode below a two volt limit (defined by region 904), the two states of PCM storage device 700 may be detected by reading the resistance of the device. It is anticipated that the positive bias voltage of two volts described as a limit may be adjusted. Also note that the electrical characteristics of diode 706 overlap in the programming region when the biasing voltage is above the two volt limit.

By now it should be apparent that a phase-change material GST deposited adjacent to a ZnO layer form a self-selected storage device. The diode formed at the ZnO/GST interface clearly shows both rectification and storage capabilities within this PCM architecture.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A Phase-Change Memory (PCM), comprising:
  a first metal line;
  a second metal line;
  a dielectric between the first and second metal lines;
  a first barrier between the first metal line and the dielectric and contacting the first metal line and the dielectric;
  a second barrier between the second metal line and the dielectric and contacting the second metal line and the dielectric;
  a first memory cell having an oxide-based material including an n-type Zinc Oxide (ZnO) material in direct contact with a natural p-type crystalline PCM material to form a diode junction embedded in the PCM material, the ZnO material contacting the first metal line;
  first material arranged in a stack with the ZnO material and the PCM material;
  a second memory cell having an oxide-based material including an n-type ZnO material in direct contact with a natural p-type crystalline PCM material to form a diode junction embedded in the PCM material, the ZnO material contacting the second metal line; and
  a second material arranged in a stack with the ZnO material and the PCM material of the second memory cell.

2. The PCM of claim 1 wherein each of the first and second metal lines includes copper.

3. The PCM of claim 1 wherein a positive bias of two volts or less forward biases the diode junction to allow detection of a state of the memory cell by reading a resistance of the PCM material.

4. The PCM of claim 1 wherein the first material includes TiN.

5. The PCM of claim 1 wherein the second material includes TiN.

6. The PCM of claim 1 wherein the PCM material is deposited directly above the ZnO material.

* * * * *